United States Patent
Roy et al.

(10) Patent No.: US 9,456,490 B2
(45) Date of Patent: Sep. 27, 2016

(54) SIGNAL PATH IN RADIO-FREQUENCY MODULE HAVING LAMINATE SUBSTRATE

(71) Applicant: SKYWORKS SOLUTIONS, INC., Wobrun, MA (US)

(72) Inventors: Ambarish Roy, Waltham, MA (US); Stephen Richard Moreschi, Peabody, MA (US)

( * ) Notice: Subject to any disclaimer, the term of this patent is extended or adjusted under 35 U.S.C. 154(b) by 104 days.

(21) Appl. No.: 14/474,128

(22) Filed: Aug. 30, 2014

(65) Prior Publication Data

US 2016/0066416 A1    Mar. 3, 2016

(51) Int. Cl.
| | |
|---|---|
| H05K 1/02 | (2006.01) |
| H05K 1/11 | (2006.01) |
| H05K 1/18 | (2006.01) |
| H04B 1/16 | (2006.01) |
| H04B 1/04 | (2006.01) |

(52) U.S. Cl.
CPC ............. H05K 1/0251 (2013.01); H04B 1/16 (2013.01); H05K 1/0243 (2013.01); H05K 1/113 (2013.01); H05K 1/181 (2013.01); H04B 2001/0408 (2013.01)

(58) Field of Classification Search
CPC .... H01L 23/00; H05K 1/0251; H05K 1/113; H05K 1/181; H05K 1/0243; H04B 1/16; H04B 2001/0408
See application file for complete search history.

(56) References Cited

U.S. PATENT DOCUMENTS

| | | | |
|---|---|---|---|
| 6,555,914 B1* | 4/2003 | Thurairajaratnam | . H01L 21/486 257/773 |
| 2006/0249810 A1* | 11/2006 | Lee | ...... H01L 23/5227 257/531 |
| 2013/0057451 A1* | 3/2013 | Petty-Weeks | ........... H01L 23/66 343/905 |
| 2014/0078014 A1* | 3/2014 | Kato | ........................ H03H 7/38 343/860 |

* cited by examiner

*Primary Examiner* — Nguyen Vo
(74) *Attorney, Agent, or Firm* — Chang & Hale LLP; James Chang; Kiranjit Dhaliwal

(57) ABSTRACT

Improved signal path in radio-frequency (RF) module having laminate substrate. In some embodiments, a laminate substrate for mounting RF components can include N conductor pads positioned at different layers of the laminate substrate. Such conductor pads can include an input pad, an output pad, and at least one intermediate pad between the input and output pads. The laminate substrate can further include a connection feature formed between each neighboring pair among the N conducting pads to provide a signal path between the input pad and the output pad. First and second connection features associated with each of the at least one intermediate pad can be positioned near opposite ends of the intermediate pad to thereby reduce parasitic effects associated with the N conductor pads. Examples of methods and devices related to such laminate substrate are disclosed.

20 Claims, 14 Drawing Sheets

SIGNAL PATH IN RADIO-FREQUENCY MODULE HAVING LAMINATE SUBSTRATE

BACKGROUND

1. Field

The present disclosure relates to improved signal path in radio-frequency (RF) module having laminate substrate.

2. Description of the Related Art

Many radio-frequency (RF) modules typically include one or more components mounted on a laminate substrate. Such a laminate substrate typically includes a number of layers having conductive features that are interconnected to provide, for example, a path for an RF signal. Such a path can introduce loss and/or noise to the RF signal.

SUMMARY

In accordance with some implementations, the present disclosure relates to a laminate substrate for mounting radio-frequency (RF) components. The laminate substrate includes N conductor pads positioned at different layers of the laminate substrate and includes an input pad, an output pad, and at least one intermediate pad between the input and output pads. The laminate substrate further includes a connection feature formed between each neighboring pair among the N conducting pads to provide a signal path between the input pad and the output pad. First and second connection features associated with each of the at least one intermediate pad are positioned near opposite ends of the intermediate pad to thereby reduce parasitic effects associated with the N conductor pads.

In some embodiments, the quantity N can have a value that is greater than or equal to 4. In some embodiments, the signal path can be an input signal path or an output signal path for an RF component. The RF component can include a low-noise amplifier (LNA).

In some embodiments, the connection feature can include one or more vias. The first and second connections features can be positioned at the opposite ends of the intermediate pad, with each of the opposite ends defining an area sufficient to allow formation of the one or more vias.

In some embodiments, the laminate substrate can further include an insulator layer disposed between each of the neighboring pair of conducting pads. In some embodiments, each of the at least one intermediate pad can have a reduced lateral dimension to facilitate the reduction in the parasitic effects associated with the N conductor pads. The different layers of the laminate substrate can further include other conductor features about the N conductor pads. The reduced lateral dimension of each of the at least one intermediate pad results in reduction of parasitic effects between the N conductor pads and the other conductor features.

According to a number of implementations, the present disclosure relates to a radio-frequency (RF) module that includes a laminate substrate configured to receive a plurality of components. The laminate substrate includes N conductor pads positioned at different layers and including an input pad, an output pad, and at least one intermediate pad between the input and output pads. The laminate substrate further includes a connection feature formed between each neighboring pair among the N conducting pads to provide a signal path between the input pad and the output pad, with first and second connection features associated with each of the at least one intermediate pad being positioned near opposite ends of the intermediate pad to thereby reduce parasitic effects associated with the N conductor pads. The RF module further includes an RF integrated circuit disposed on the laminate substrate. The RF integrated circuit is connected to the output pad of the signal path.

In some embodiments, the RF integrated circuit can include a low-noise amplifier (LNA). The reduced parasitic effects associated with the N conductor pads can result in a reduced noise figure associated with the LNA. The output pad of the signal path can be connected to an input of the LNA. The RF module can further include a matching circuit disposed between the output pad of the signal path and the input of the LNA.

In some embodiments, the output pad of the signal path can be connected to an output of the LNA. The RF module can further include a matching circuit disposed between the output of the LNA and the output pad of the signal path. In some embodiments, the RF integrated circuit can be implemented on a semiconductor die.

In some implementations, the present disclosure relates to a wireless device that includes an antenna configured to receive a radio-frequency (RF) signal. The wireless device further includes a low-noise amplifier (LNA) module connected to the antenna. The LNA module includes an LNA configured to amplify the RF signal. The LNA module further includes a laminate substrate having a signal path for routing the RF signal to the LNA. The signal path includes N conductor pads positioned at different layers and includes an input pad, an output pad, and at least one intermediate pad between the input and output pads. The signal path further includes a connection feature formed between each neighboring pair among the N conducting pads to provide an electrical connection between the input pad and the output pad. First and second connection features associated with each of the at least one intermediate pad are positioned near opposite ends of the intermediate pad to thereby reduce parasitic effects associated with the N conductor pads and reduce a noise figure of the LNA. The wireless device further includes a receiver circuit connected to the LNA module. The receiver circuit is configured to process the amplified RF signal received from the LNA module.

According to some teachings, the present disclosure relates to a laminate substrate for mounting radio-frequency (RF) components. The laminate substrate includes a plurality of conductor pads positioned at different layers. The laminate substrate further includes a connection feature formed between each neighboring pair among the plurality of conductor pads to provide a signal path between two end ones among the plurality of conductor pads. At least one of the plurality of conductor pads defines a cutout to reduce overlap between it and a neighboring conductor pad to thereby reduce parasitic effect associated with the signal path.

In some embodiments, the signal path can be an input signal path or an output signal path for an RF component. The RF component can include a low-noise amplifier (LNA).

In some embodiments, the connection feature can include one or more vias. The plurality of conductor pads can include an input pad, an output pad, and at least one intermediate pad, with the input and output pads being the two end pads of the signal path. The intermediate pad can define the cutout. The intermediate pad can have an L shape, with the cutout being defined by the two legs of the L shape. Two legs of the L shape can be dimensioned to support their respective vias extending in opposite directions.

In some embodiments, the laminate substrate can further include an insulator layer disposed between each of the neighboring pair of conductor pads. In some embodiments, each of the plurality of conductor pads can have a reduced lateral dimension to facilitate the reduction in the parasitic effects associated with the signal path. The different layers of the laminate substrate can further include other conductor features about the plurality of conductor pads. The reduced lateral dimension of each of the plurality of conductor pads can result in reduction of parasitic effects between the plurality of conductor pads and the other conductor features.

In a number of teachings, the present disclosure relates to a radio-frequency (RF) module that includes a laminate substrate configured to receive a plurality of components. The laminate substrate includes a plurality of conductor pads positioned at different layers. The laminate substrate further includes a connection feature formed between each neighboring pair among the plurality of conductor pads to provide a signal path between two end ones among the plurality of conductor pads. At least one of the plurality of conductor pads defines a cutout to reduce overlap between it and a neighboring conductor pad to thereby reduce parasitic effect associated with the signal path. The RF module further includes an RF integrated circuit disposed on the laminate substrate. The RF integrated circuit is connected to one of the end pads of the signal path.

In some embodiments, the RF integrated circuit can include a low-noise amplifier (LNA). The reduced parasitic effects associated with the plurality of conductor pads can result in a reduced noise figure associated with the LNA. The RF module can further include a matching circuit disposed between the signal path and an input of the LNA. In some embodiments, the RF integrated circuit can be implemented on a semiconductor die.

In some implementations, the present disclosure relates to a wireless device that includes an antenna configured to receive a radio-frequency (RF) signal. The wireless device further includes a low-noise amplifier (LNA) module connected to the antenna. The LNA module includes an LNA configured to amplify the RF signal. The LNA module further includes a laminate substrate having a signal path for routing the RF signal to the LNA. The signal path includes a plurality of conductor pads positioned at different layers. The signal path further includes a connection feature formed between each neighboring pair among the plurality of conductor pads to electrically connect two end ones among the plurality of conductor pads, with at least one of the plurality of conductor pads defining a cutout to reduce overlap between it and a neighboring conductor pad to thereby reduce parasitic effect associated with the signal path. The wireless device further includes a receiver circuit connected to the LNA module. The receiver circuit is configured to process the amplified RF signal received from the LNA module.

For purposes of summarizing the disclosure, certain aspects, advantages and novel features of the inventions have been described herein. It is to be understood that not necessarily all such advantages may be achieved in accordance with any particular embodiment of the invention. Thus, the invention may be embodied or carried out in a manner that achieves or optimizes one advantage or group of advantages as taught herein without necessarily achieving other advantages as may be taught or suggested herein.

DETAILED DESCRIPTION OF SOME EMBODIMENTS

The headings provided herein, if any, are for convenience only and do not necessarily affect the scope or meaning of the claimed invention.

Figure 1:
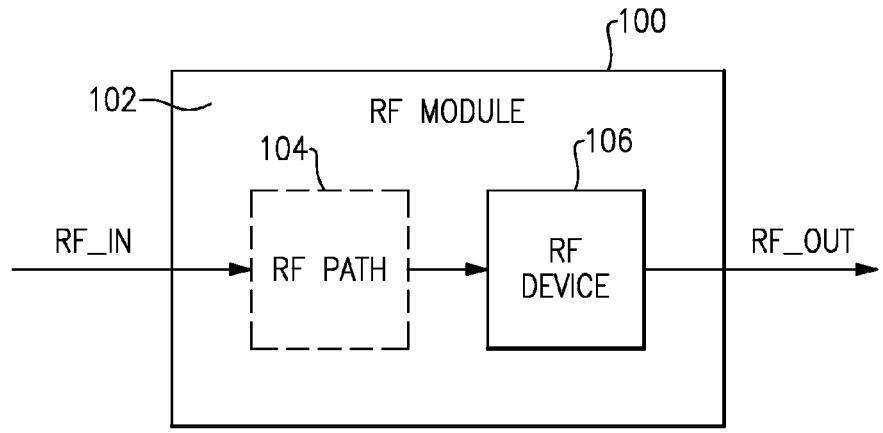
FIG. 1 schematically depicts a radio-frequency (RF) module having an RF path configured to provide improved performance.

Described herein are various examples of a radio-frequency (RF) signal path in a laminate module can be configured to provide desirable performance features. FIG. 1 schematically depicts an RF module 100 having a laminate substrate 102. For the purpose of description, it will be understood that the laminate substrate 102 can include a plurality of layers of conductor features separated by insulating material. In some embodiments, such layers of conductive features can be formed on their respective dielectric layers, and such dielectric layers can be laminated together to form the laminate substrate 102. Electrical connections between the layers can be facilitated by, for example, conductive vias formed through the layers.

The laminate substrate 102 is shown to include an RF path 104 among the plurality of layers. In some embodiments, the RF path 104 can be configured to provide a pathway for an RF signal between an input (RF_IN) and an RF device 106.

The RF device 106 can be configured to process the received RF signal and generate an output (RF_OUT).

Various examples of the RF path 104 are described herein in greater detail in the context of the foregoing input RF signals. It will be understood, however, that one of more features of the present disclosure can also be implemented in other signal path applications. For example, one or more features as described herein can be implemented in signal paths involving laminate layers and where reduction or control of parasitic effects are desired.

Figure 2A:
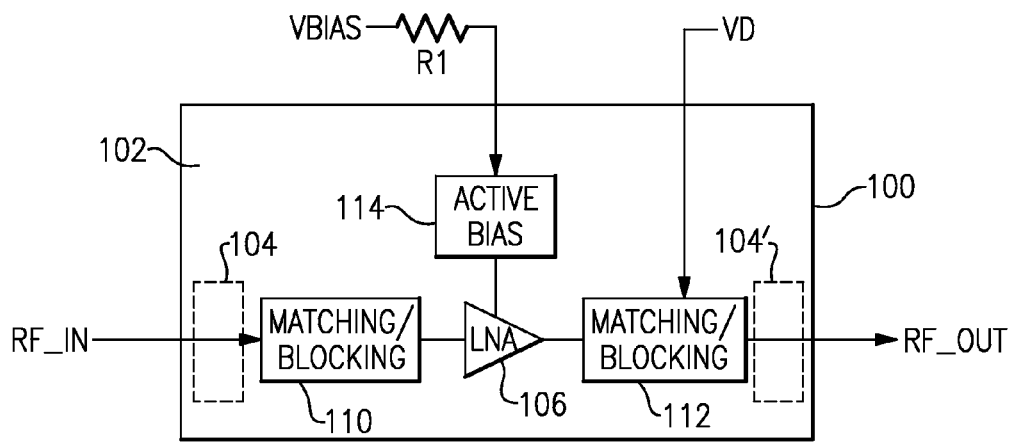
FIGS. 2A and 2B show that the RF module of FIG. 1 can be a low-noise amplifier (LNA) module where one or more RF paths can provide reduced noise figure.
Figure 2B:
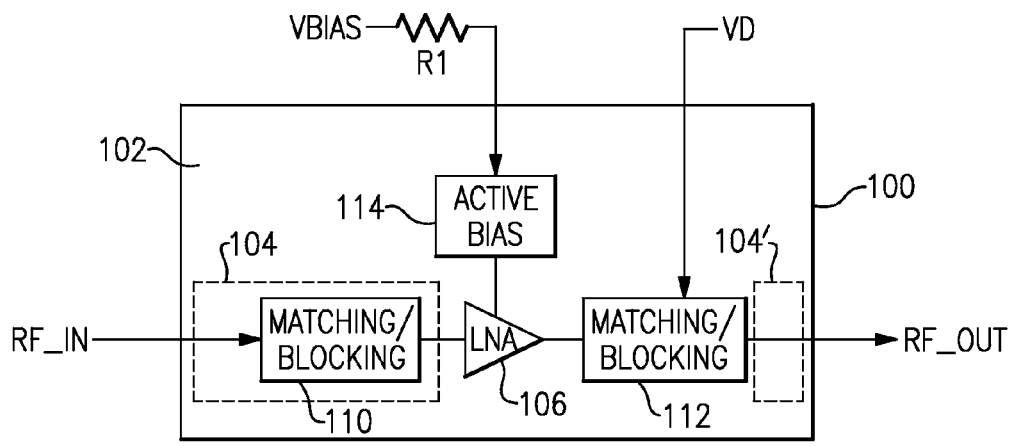

FIGS. 2A and 2B show that in some embodiments, the module 100 of FIG. 1 can be a low-noise amplifier (LNA) module 100. The LNA module 100 can include one or more RF paths 104, 104' having one or more features as described herein, and such RF paths can facilitate routing of RF signals to and from an LNA 106. For example, and as shown in FIG. 2A, an RF signal can be routed from an input (RF_IN) to an LNA 106 through the RF path 104 and a matching/blocking circuit 110; and the amplified RF signal from the LNA 106 can be routed to an output (RF_OUT) through a matching/blocking circuit 112 and the RF path 104'. As shown, the LNA 106 can be biased by a bias circuit 114 (e.g., an active bias circuit). In some embodiments, and as shown in the example of FIG. 2B, the RF path 104 can include one or more features as described herein at one or more locations along the input side of the LNA 106. Similarly, one or more features as described herein can also be implemented at one or more locations on the output side of the LNA.

Various examples of the RF paths 104, 104' are described herein in greater detail in the context of the foregoing LNA module 100. It will be understood, however, that one of more features of the present disclosure can also be implemented in other types of RF modules. Various examples of the RF paths are described herein in the context of input RF paths; however, as shown in FIG. 2, other types of signal paths (e.g., output RF path or an intermediate RF path) can also benefit from one or more features of the present disclosure.

In the context of LNA modules, one or more features of the present disclosure can be implemented for different types of LNAs. For example, LNAs based on gallium arsenide (GaAs) process technology and silicon-on-insulator (SOI) process technology can benefit from use of RF paths as described herein.

Figure 3A:
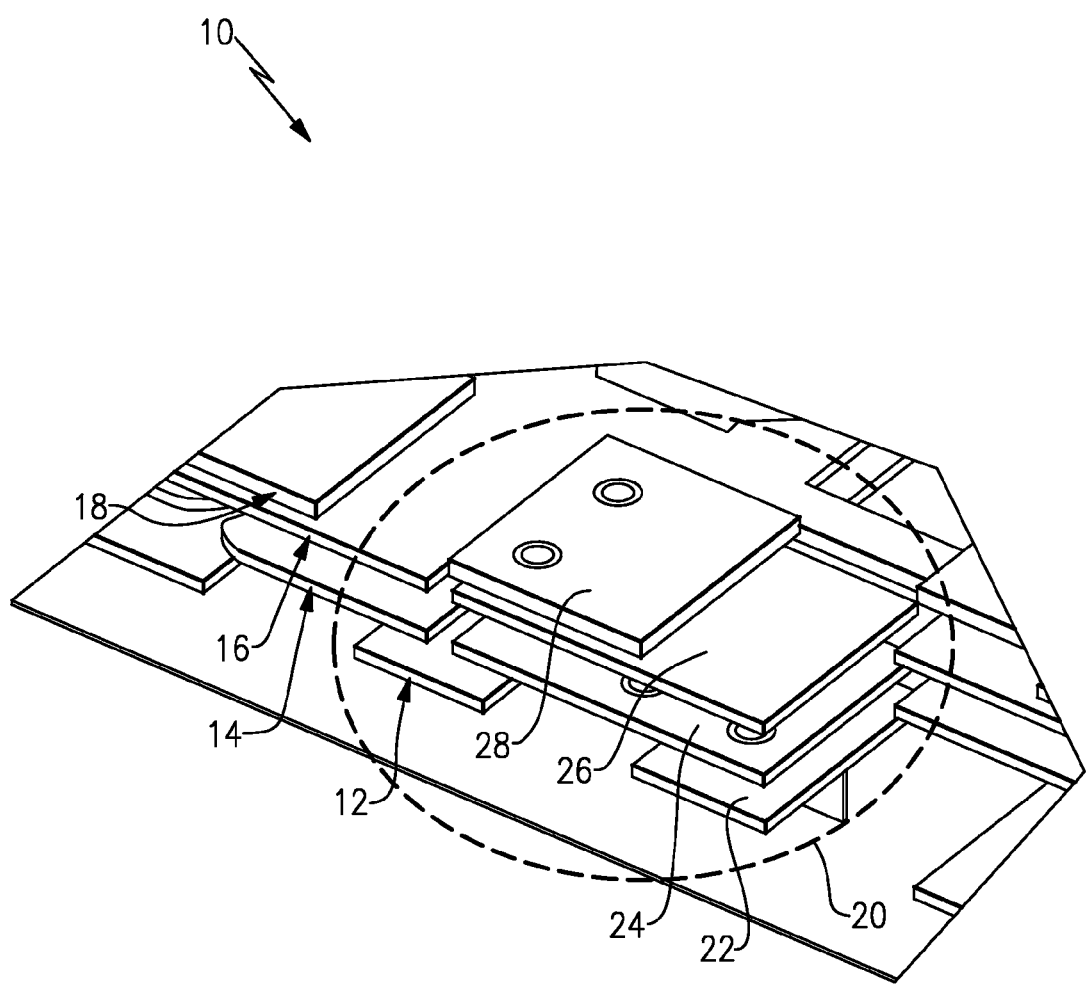
FIG. 3A shows an example of a laminate structure having multiple layers of conductive features.

FIG. 3A shows an example laminate configuration 10 having four layers (12, 14, 16, 18) of conductors, including conductor pads (22, 24, 26, 28) for an RF signal path 20 that can be utilized as an input. Although described in the context of four example layers, it will be understood that other numbers of layers can also be utilized. For example, laminate configurations having 2, 3, 4, 5, or higher number of layers can benefit from one or more features described herein.

Figure 3B:
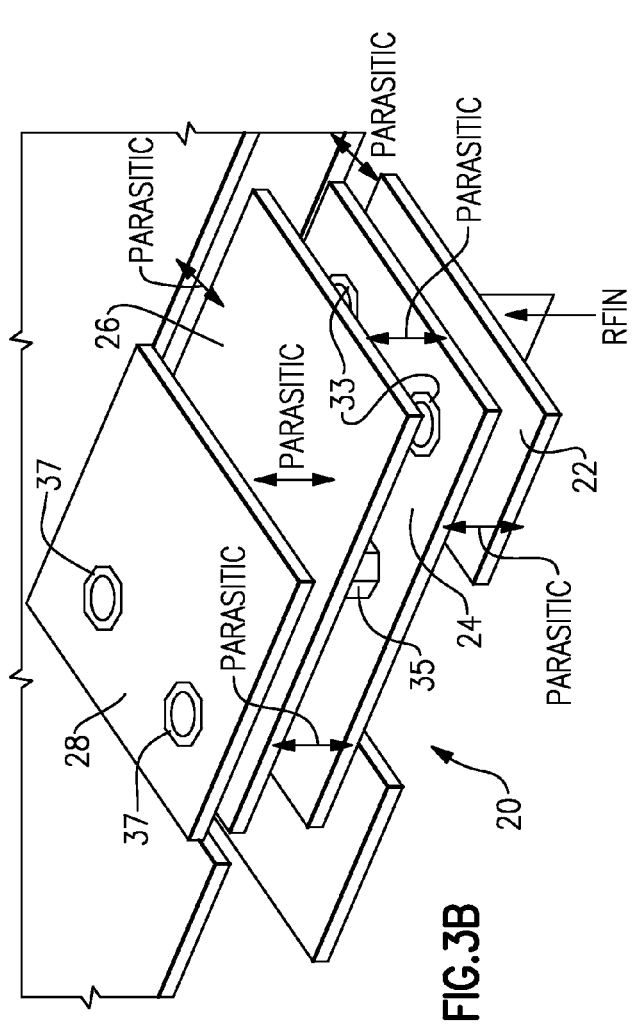
FIG. 3B shows that some of the conductive features of FIG. 3A can be configured to provide an input path for an RF signal, and such a path can suffer from parasitic effects.

FIG. 3B shows an enlarged view of the signal path 20 formed between the first pad 22 (where input signal RFIN is received) and the fourth pad 28 (which is connected to an input matching component of an LNA (not shown)). The first pad 22 is shown to be electrically connected to the second pad 24 through conductive vias 33; the second pad 24 is shown to be electrically connected to the third pad 26 through conductive vias 35; and the third pad 26 is shown to be electrically connected to the fourth pad 28 through conductive vias 37.

In the example of FIG. 3B, parasitic effects such as parasitic capacitance can result due to the pads being in proximity to each other as well as other conductive features in their respective layers. For example, parasitic capacitance can be present between the first and second pads (22, 24), between the second and third pads (24, 26), between the third and fourth pads (26, 28). Parasitic capacitance can also be present between a given pad and other conductor feature (s) in the same layer. Each of the first and third pads (22, 26) and its respective nearby conductor are shown to yield parasitic capacitance. The second and fourth pads (24, 28) can also yield such parasitic capacitances. Although described in the context of parasitic capacitance, it will be understood that other effects can also contribute to the parasitic effects. For example, due to conductive pads at different layers, parasitic inductances and resistances can be present in a given RF path. Such parasitic capacitance, inductance and resistance can collectively form an unwanted series of parasitic elements in the RF path.

Figure 4:
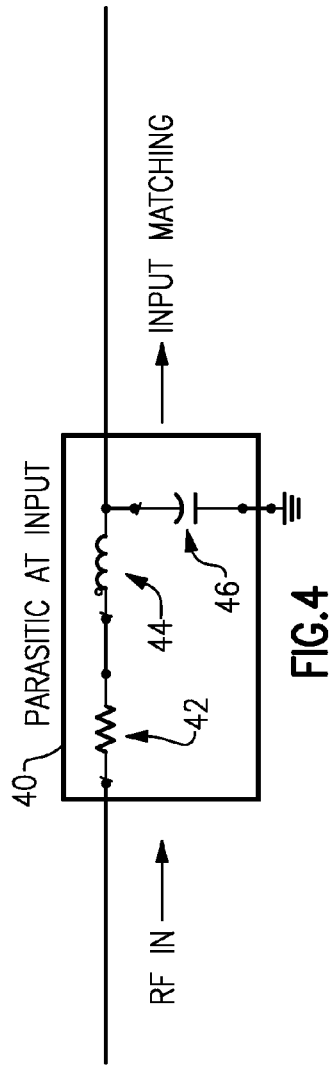
FIG. 4 schematically depicts a circuit that can represent the parasitic effects associated with the input path of FIGS. 3A and 3B.

FIG. 4 schematically shows that the foregoing parasitic effects associated with the signal path 20 can be represented by a parasitic circuit 40 having a resistance 42, an inductance 44, and a capacitance 46. As is generally understood, such parasitic effects can result in degradation of an RF signal to yield, for example, an increase in noise figure (NF) and/or RF loss. If the parasitic effect is sufficiently large (e.g., depending on the number of pads and layers), the parasitic circuit 40 can contribute significantly to, for example, the matching/blocking circuits 110, 112 described herein in reference to FIG. 2. Although the example parasitic circuit 40 in FIG. 4 is depicted as a simple series/parallel representation, it will be understood that the circuit may contain more passive elements that are represented here collectively in the simplified circuit 40. It will also be understood that while various examples are described herein in the context of noise figure problems and improvements, one or more features of the present disclosure can address and improve performance associated with RF loss and/or other issues related to parasitic effects.

Figure 5:
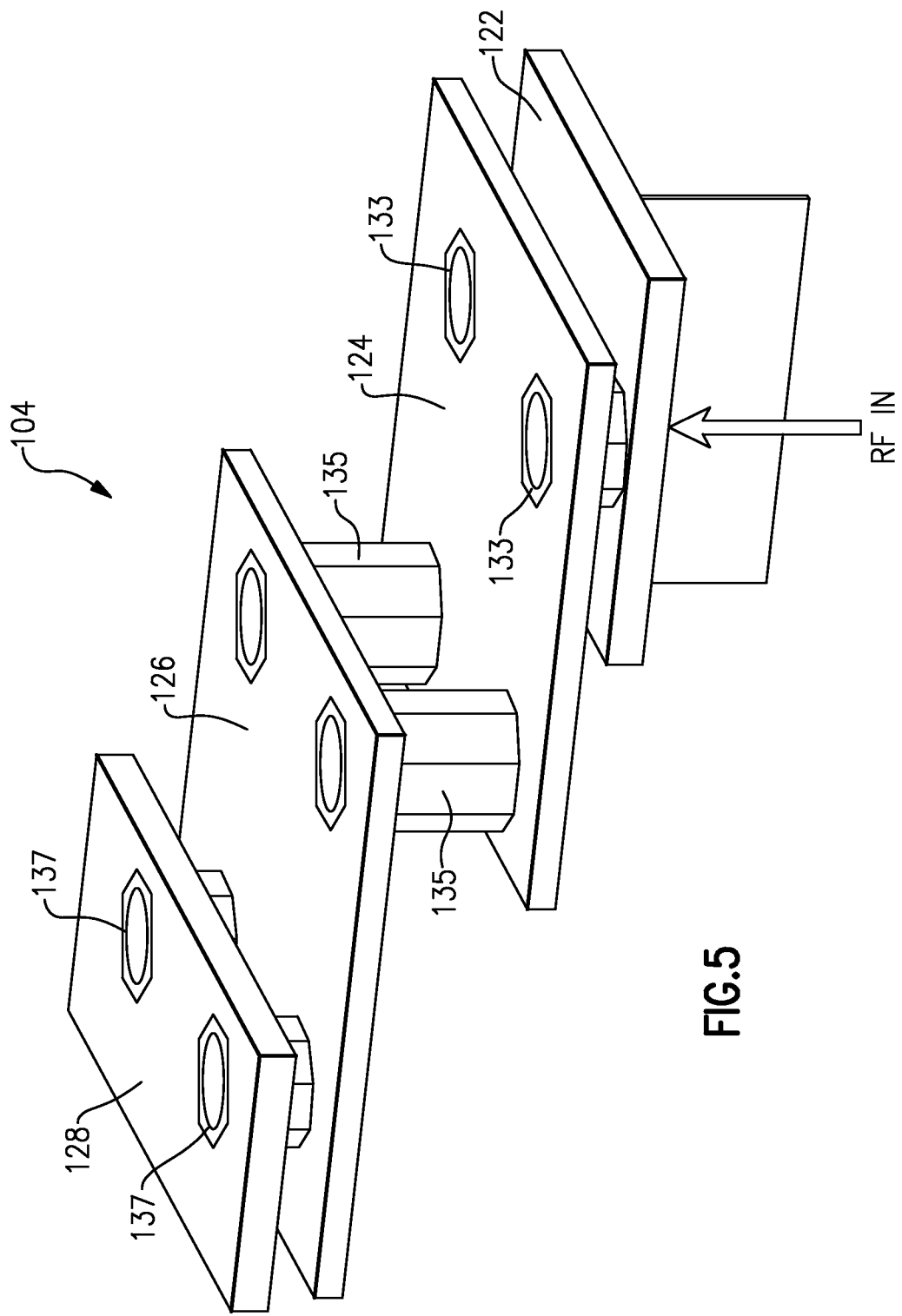
FIG. 5 shows an example of a modified input path that can be configured to reduce parasitic effects and yield performance improvements such as reduction in noise figure.

FIG. 5 shows an example of a modified signal path 104 that can be configured to reduce the parasitic effects, and thereby improve the noise figure performance. Similar to the example of FIG. 3B, the modified signal path 104 is described in the context of four layers. It will be understood, however, one or more features as described herein can be implemented in laminate devices having more or less number of layers.

In the example shown in FIG. 5, the signal path 104 is formed between a first pad 122 (where input signal RFIN is received) and a fourth pad 128 (which is connected to an input of an LNA (not shown)). The first pad 122 is shown to be electrically connected to a second pad 124 through conductive vias 133; the second pad 124 is shown to be electrically connected to a third pad 126 through conductive vias 135; and the third pad 126 is shown to be electrically connected to the fourth pad 128 through conductive vias 137.

Figure 6:
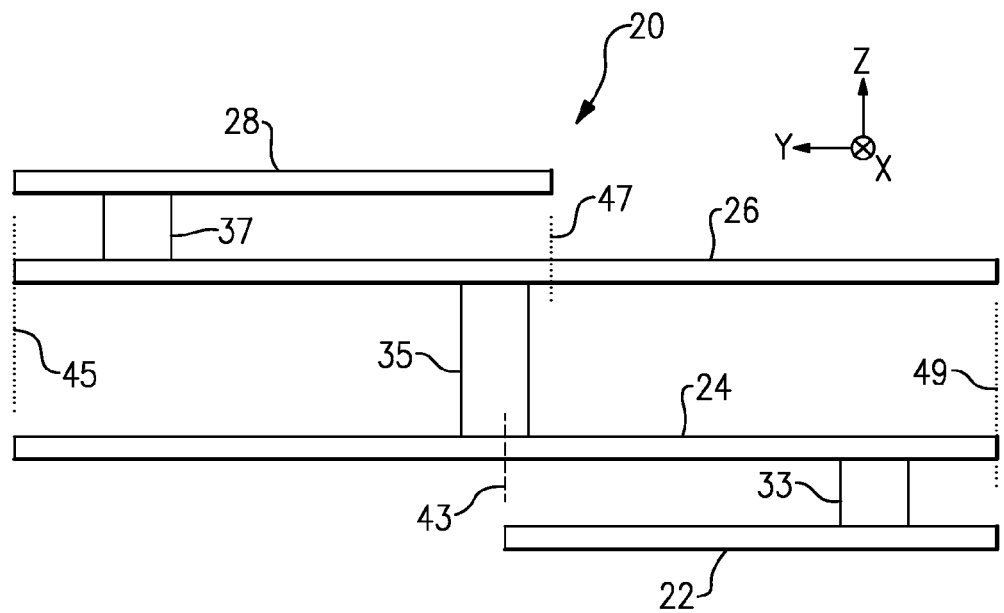
FIG. 6 shows a side view of the input path configuration of FIG. 3B.
Figure 7:
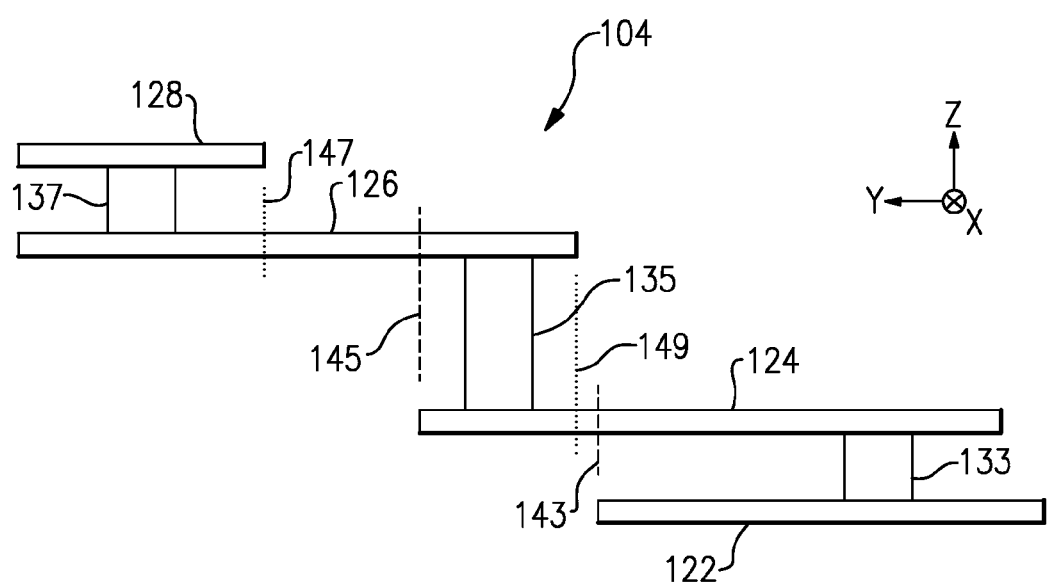
FIG. 7 shows a side view of the input path configuration of FIG. 5.

Differences between the foregoing modified signal path 104 of FIG. 5 and the signal path 20 of FIG. 3B are depicted in FIGS. 6 and 7. FIG. 6 shows a side view of the signal path 20 of FIG. 3B, and FIG. 7 shows a side view of the modified signal path 104 of FIG. 5. For the purpose of description, the conductive features about the pads at different layers of the examples of FIGS. 3B and 5 can remain generally the same (e.g., to provide comparison in performance between the two configurations). However, it will be understood that the modified signal path 104 of FIG. 5 is not required to have similar nearby conductors as those associated with the signal path 20 of FIG. 3B.

As shown, the pads of the modified signal path 104 are dimensioned and arranged so that an overlap between a pair of vertically neighboring pads overlap significantly less than that of the corresponding pair of pads of the signal path 20. For example, the left edge (indicated by line 43) of the first pad 22 in FIG. 6 is shown to extend approximately to a midpoint of the second pad 24 and overlap with at least a portion of the via 35. In contrast, the left edge (indicated by line 143) of the first pad 122 in FIG. 7 is shown to extend significantly less to thereby significantly reduce the amount of overlap between the first and second pads 122, 124. The left edge 143 of the first pad 122 is also shown to not overlap with the via 135.

In another example, the left edge (indicated by line 45) of the second pad 24 in FIG. 6 is shown to extend approximately to the left edge of the third pad 26 and overlap with the via 37. Similarly, the right edge (indicated by line 49) of the third pad 26 in FIG. 6 is shown to extend approximately to the right edge of the second pad 24 and overlap with the via 33. In contrast, the left edge (indicated by line 145) of the second pad 124 and the right edge (indicated by line 149) of the third pad 126 in FIG. 7 are shown to extend significantly less to thereby significantly reduce the amount of overlap between the second and third pads 124, 126. The left edge 145 of the second pad 124 is shown to not overlap with the via 137, and the right edge 149 of the third pad 126 is shown to not overlap with the via 133.

In yet another example, the right edge (indicated by line 47) of the fourth pad 28 in FIG. 6 is shown to extend approximately to a midpoint of the third pad 26 and overlap with the via 35. In contrast, the right edge (indicated by line 147) of the fourth pad 128 in FIG. 7 is shown to extend significantly less to thereby significantly reduce the amount of overlap between the fourth and third pads 128, 126. The right edge 147 of the fourth pad 128 is also shown to not overlap with the via 135.

In some embodiments the foregoing reduced overlaps between neighboring pads in the example signal path 104 can be achieved by dimensioning the neighboring pads so that their overlapping portions are generally limited by one or more parameters. For example, the first pad 122 acting as an input contact pad for an input RF signal from outside of the module may be required to have a minimum surface area per a design specification. Accordingly, the first pad 122 can have its area reduced to approximately such a minimum area to thereby reduce the amount of overlap with the second pad 124. In some embodiments, the foregoing reduced area of the first pad 122 can allow the area of the pad to be shifted laterally and still be within the design specification. Thus, in the example shown, the first pad 122 is shown to be shifted slightly to the right side, thereby further reducing the amount of overlap with the second pad 124.

The second pad 124 can also be configured to reduce its overlap with the first pad 122. For example, the right side of the pad 124 can be configured to extend sufficiently to facilitate effective connection with the via 133, but not extend significantly further to reduce the amount of overlap on the right side of the via 133.

The left side of the second pad 124 can also be configured to extend sufficiently to facilitate effective connection with the via 135, but not extend significantly further. Similarly, the right side of the third pad 126 can also be configured to extend sufficiently to facilitate effective connection with the via 135, but not extend significantly further. Such configurations of the second and third pads 124, 126 can allow electrical connections between the two pads with reduced or minimized overlap.

The fourth pad 128 can function as an output pad of the signal path 104, and is shown to be connected to the via 137.

In some embodiments, the fourth pad 128 can be dimensioned so that its left and right sides extend sufficiently to facilitate effective connection with the via 137, but not extend significantly further. Such a configuration of the fourth pad 128 can allow its electrical connection with the third pad 126 with reduced or minimized overlap.

In the foregoing example, the first pad 122 has lateral dimensions of approximately 250 μm×250 μm which is or close to a minimum area needed to hold the vias. Each of the vias has a diameter of about 230 m in diameter. Pad sizes in different layers can vary with the routing of the signal from the input (e.g., bottom-most pad) to the output (e.g., top-most pad). In some embodiments, such pad sizes can be based on two conditions: (1) Minimize or reduce pad size at each layer but sufficient enough to accommodate signal routing via(s), and (2) Minimize or reduce overlap between two neighboring pads.

Figure 8A:
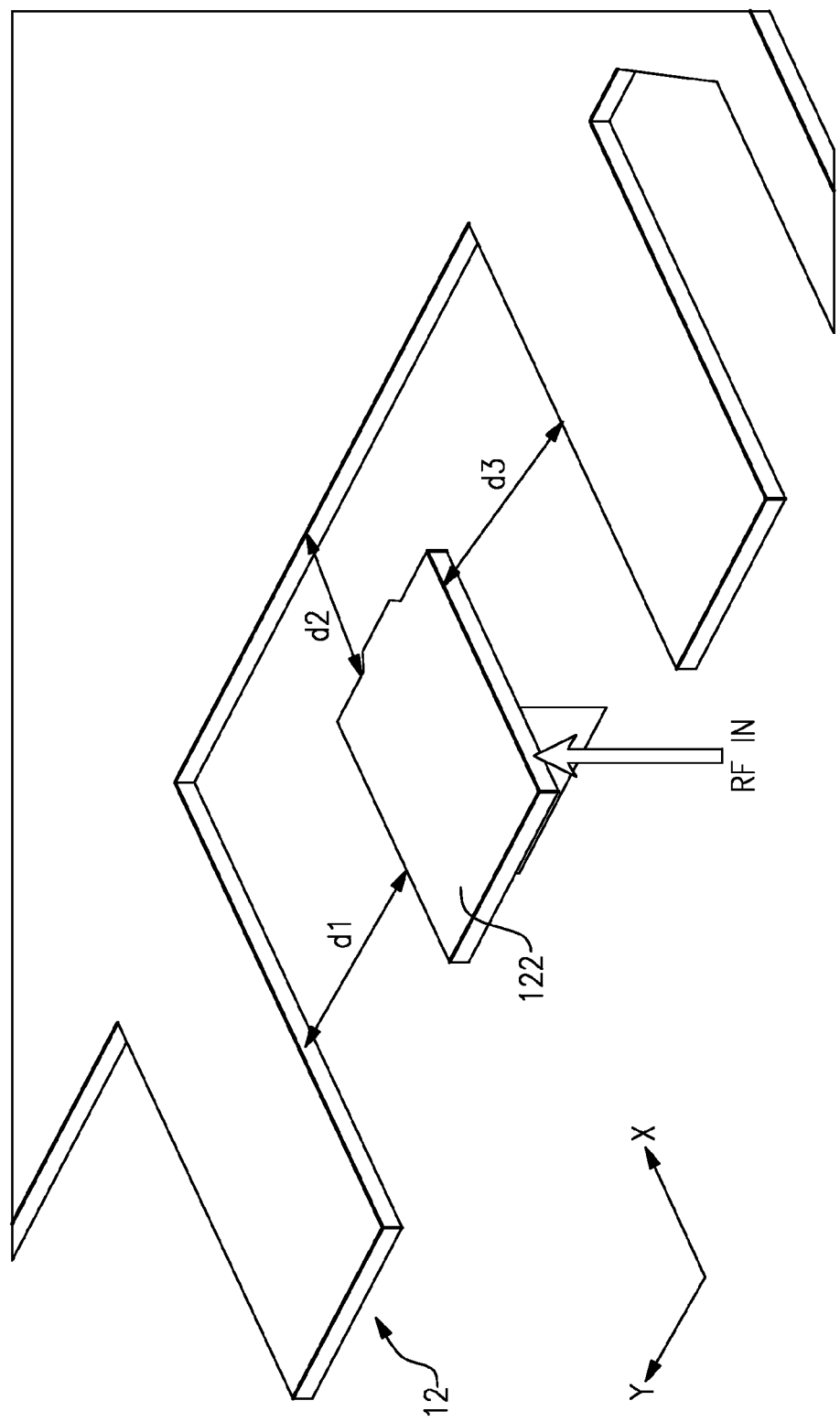
FIGS. 8A-8C show orientations of various conductor pads of the input path of FIG. 5 relative to other conductors in their respective layers.
Figure 8B:
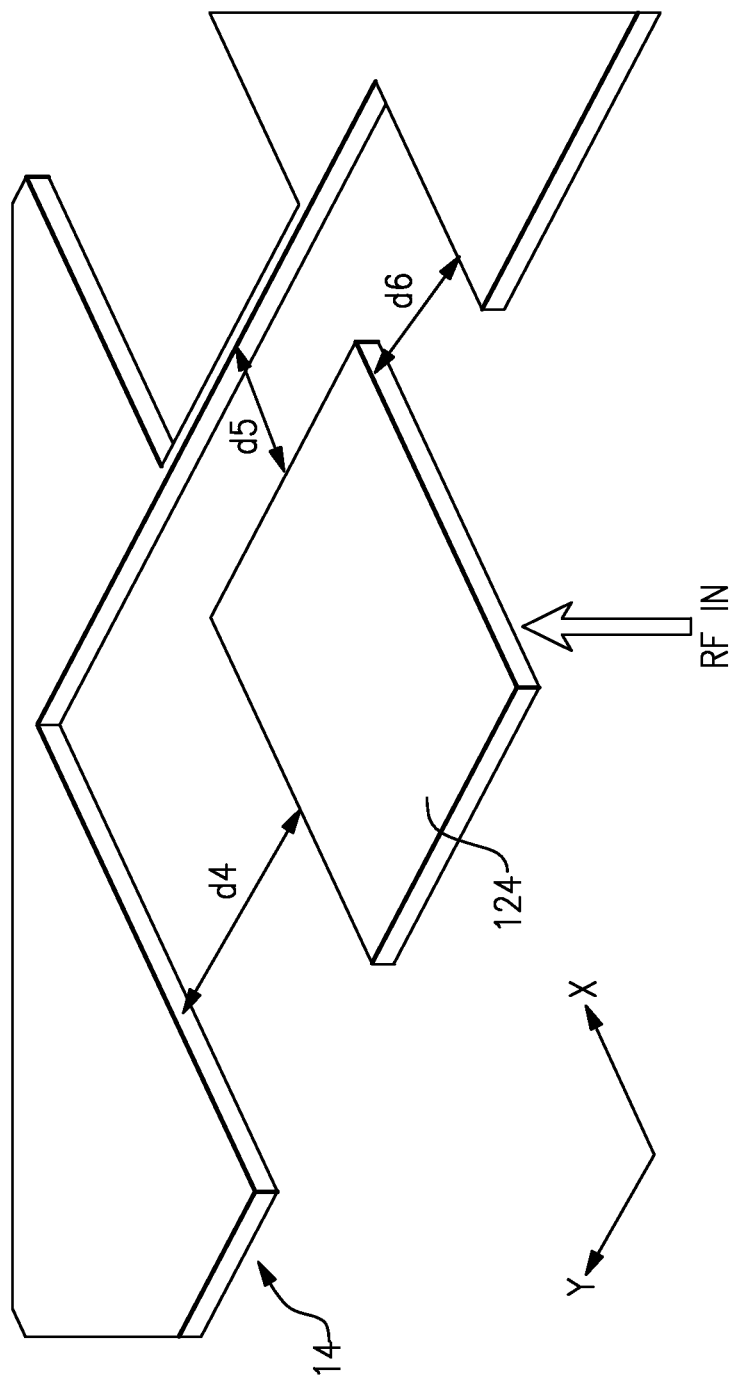
Figure 8C:
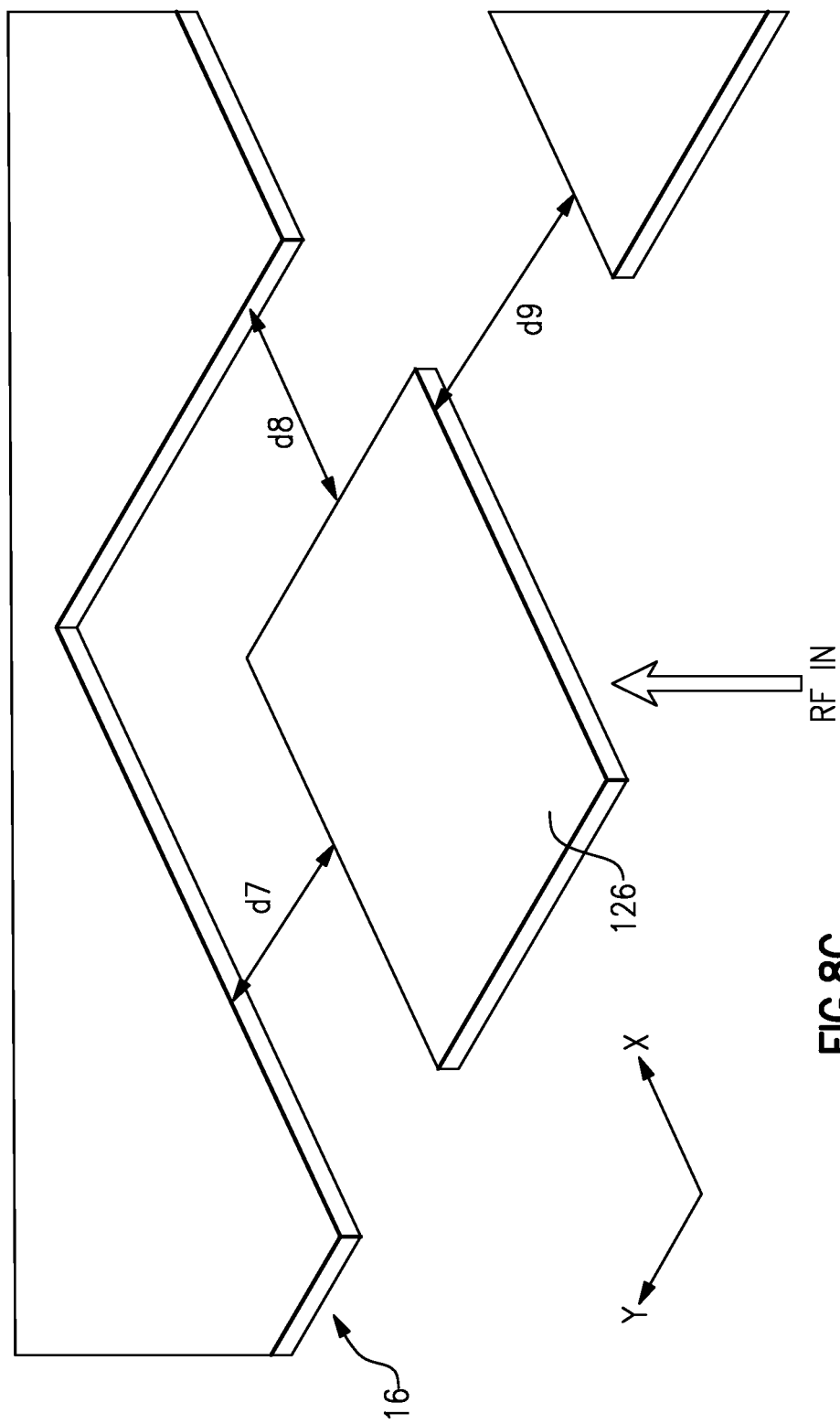

FIGS. 8A-8C show the first, second, and third pads 122, 124, 126 of the 4-layer example described herein in reference to FIG. 7. Such pads are shown relative to other portions of their respective conductive layers 12, 14, 16. For the purpose of description of FIGS. 8A-8C, it will be assumed that such other portions of the conductive layers 12, 14, 16 can remain substantially the same as those associated with the signal path 20 of FIGS. 3A, 3B, and 6 to, for example, demonstrate additional advantages that can be obtained from the reduced-overlap examples of FIGS. 5 and 7. It will be understood, however, that such other portions of the conductive layers 12, 14, 16 can also be modified to yield a desired performance with the modified the modified pads 122, 124, 126. It will also be understood that one or more features associated with the conductive layers 12, 14, 16 can also be implemented in the fourth conductive layer 18.

In FIG. 8A, the first pad 122 as described in reference to FIG. 7 is shown to yield gaps d1 and d3 along the Y-direction, and d2 along the X-direction. Each of the gaps d1, d2 and d3 can be increased from the unmodified configuration of FIG. 6 to thereby reduce the parasitic coupling between the corresponding edge of the pad 122 and the edge it faces.

In FIG. 8B, the second pad 124 as described in reference to FIG. 7 is shown to yield gaps d4 and d6 along the Y-direction, and d5 along the X-direction. The gap d4 is increased significantly from the unmodified configuration of FIG. 6 to thereby reduce the parasitic coupling between the corresponding edge of the pad 124 and the edge it faces. In the example shown, each of the gaps d6 and d5 can also be increased to thereby reduce the parasitic coupling between the corresponding edge of the pad 124 and the edge it faces.

In FIG. 8C, the third pad 126 as described in reference to FIG. 7 is shown to yield gaps d7 and d9 along the Y-direction, and d8 along the X-direction. The gap d9 is increased significantly from the unmodified configuration of FIG. 6 to thereby reduce the parasitic coupling between the corresponding edge of the pad 126 and the edge it faces. In the example shown, each of the gaps d7 and d8 can also be increased to thereby reduce the parasitic coupling between the corresponding edge of the pad 126 and the edge it faces.

Figure 9:
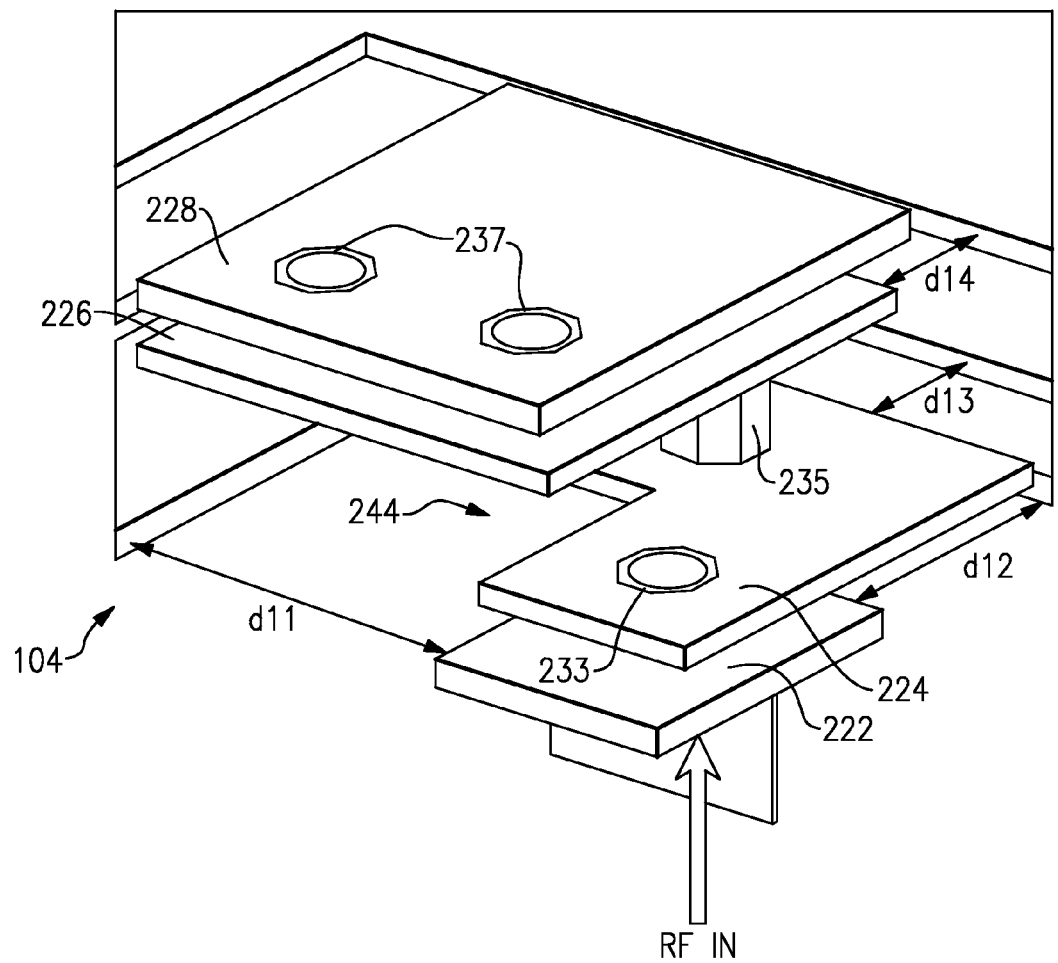
FIG. 9 shows another example of a modified input path that can be configured to reduce parasitic effects and also yield a reduced footprint size.

FIG. 9 shows another example of a modified signal path 104 that can be configured to reduce the parasitic effects, and to provide a reduced footprint. Similar to the other examples described herein, the modified signal path 104 is described in the context of four layers. It will be understood, however, one or more features as described herein can be implemented in laminate devices having more or less number of layers.

In the example shown in FIG. 9, the signal path 104 is formed between a first pad 222 (where input signal RF_IN is received) and a fourth pad 228 (which is connected to an input matching circuit of an LNA (not shown)). The first pad 222 is shown to be electrically connected to a second pad 224 through a conductive via 233; the second pad 224 is shown to be electrically connected to a third pad 226 through a conductive via 235; and the third pad 226 is shown to be electrically connected to the fourth pad 228 through conductive vias 237.

In the example signal path 104 of FIG. 9, the four pads 222, 224, 226, 228 are shown to be stacked closer to each other when viewed from the top, thereby reducing the overall footprint taken up by the signal path 104. To accommodate such a reduced footprint, rectangular areas corresponding to the four pads 222, 224, 226, 228 generally overlap with each other. However, by applying one or more of the design criteria as described herein to some or all of the four pads 222, 224, 226, 228, the signal path 104 can be configured to yield reduced parasitics among the pads as well as with the surrounding conductors, to thereby reduce the noise figure of the LNA.

The first pad 222 is shown to have reduced lateral dimensions so as to increase the gaps d11 and d12 between two of its edges with the corresponding edges on the surrounding conductor to thereby reduce parasitic effects. The reduced size of the first pad 222 is also shown to reduce the amount of overlap with the second pad 224 which has an L shape that defines a cutout 244. Thus, the first pad 222 overlaps with only a portion (e.g., area sufficient to support the via 233) of one of the legs of the L-shaped pad 224. The cutout 244 also generally increases the gap between the edges of the cutout and the corresponding edge on the surrounding conductor, thereby reducing the parasitic effects. The second pad 224 can also be dimensioned so as to increase the gap dimension d13 to further reduce the parasitic effects.

The amount of overlap between the second and third pads 224, 226 is shown to be reduced by the cutout 244 in the second pad 224. Thus, one can see that the second pad 224 is shaped and dimensioned to support the two vias 233 and 235 and to provide electrical connections therebetween. The example L shape allows such vias to be arranged in a more flexible manner.

The third pad 226 can have reduced lateral dimensions so as to increase the gaps between two of its edges and the corresponding edges of the surrounding conductor, thereby further reducing the parasitic effects. The third pad 226 and the fourth pad 228 are shown to overlap significantly. However, the actual overlapped area can be reduced by the reduced sizes of the two pads 226, 228. In the example shown, the outer portions of the third and fourth pads 226, 228 are shown to be dimensioned sufficiently to support the two vias 237. The inner side of the third pad 226 is shown to extend only enough to support the via 235 between it and the second pad 224.

Figure 10:
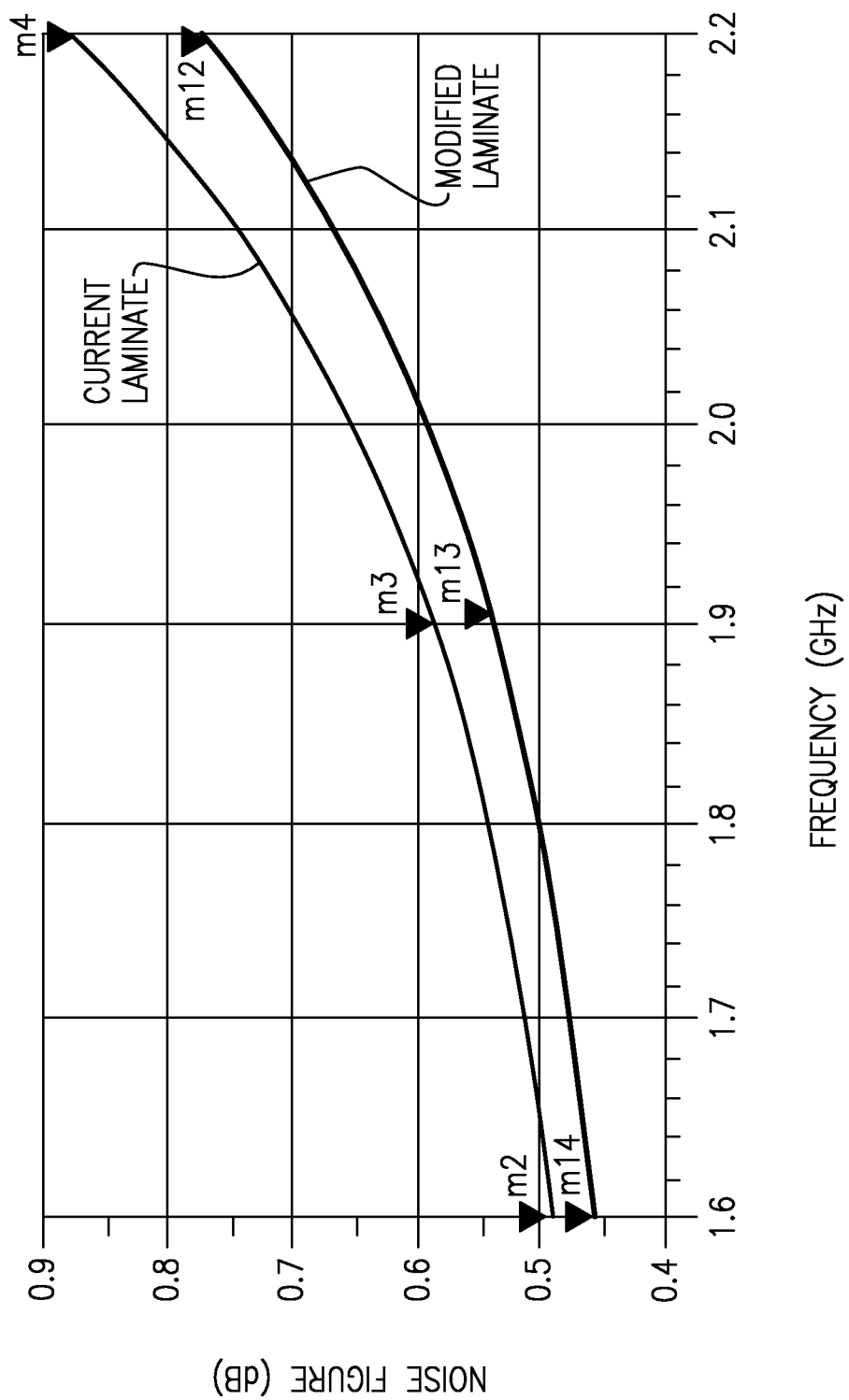
FIG. 10 shows examples of simulated noise figures (NF) for an LNA having a current laminate (upper curve), and for an LNA having the modified laminate (lower curve) configuration of FIG. 9.
Figure 11:
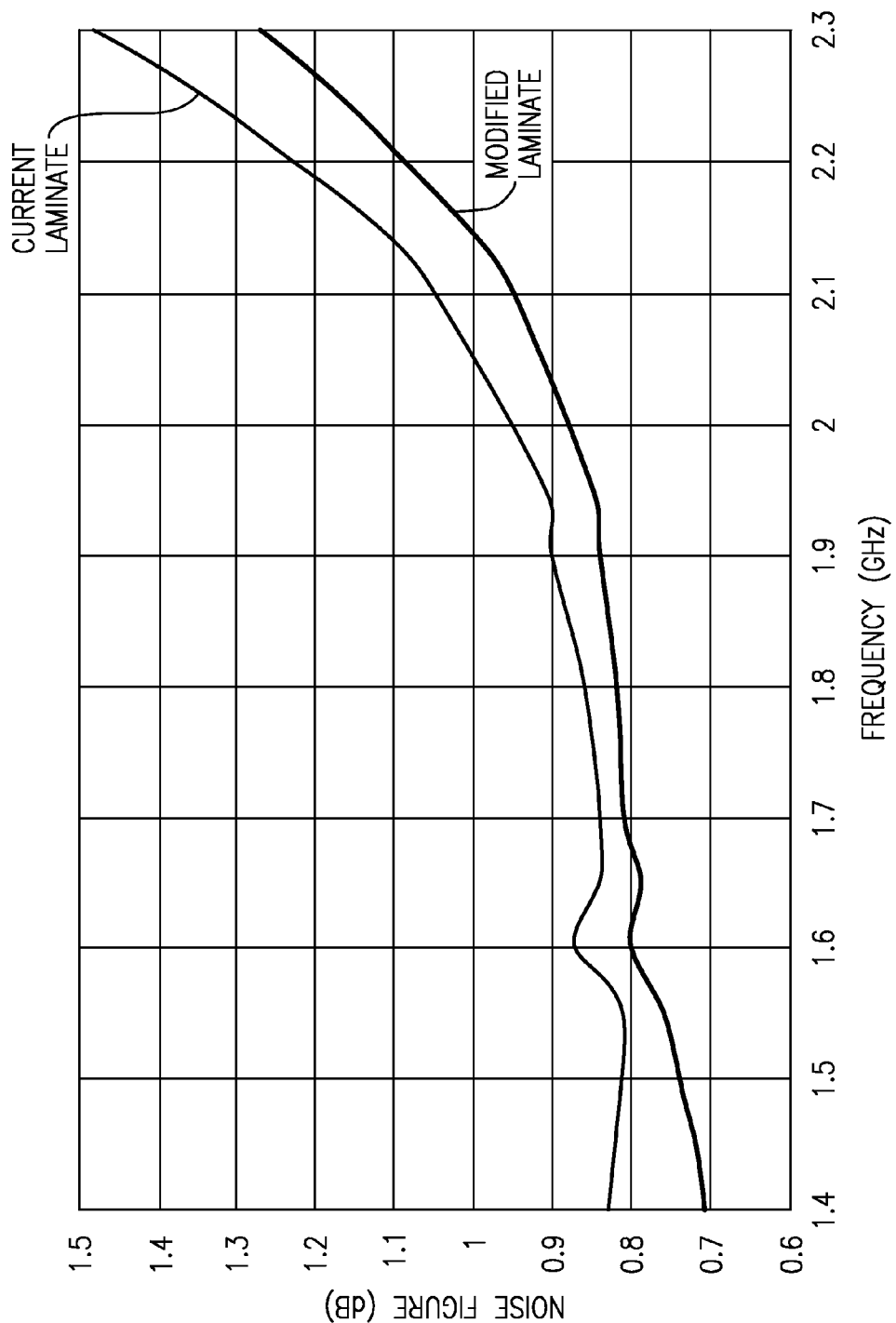
FIG. 11 shows examples of measured noise figures (NF) for LNAs having the current laminate (upper curve) and the modified laminate (lower curve) of FIG. 9 in an example frequency range of 1.4 to 2.4 GHz.
Figure 12:
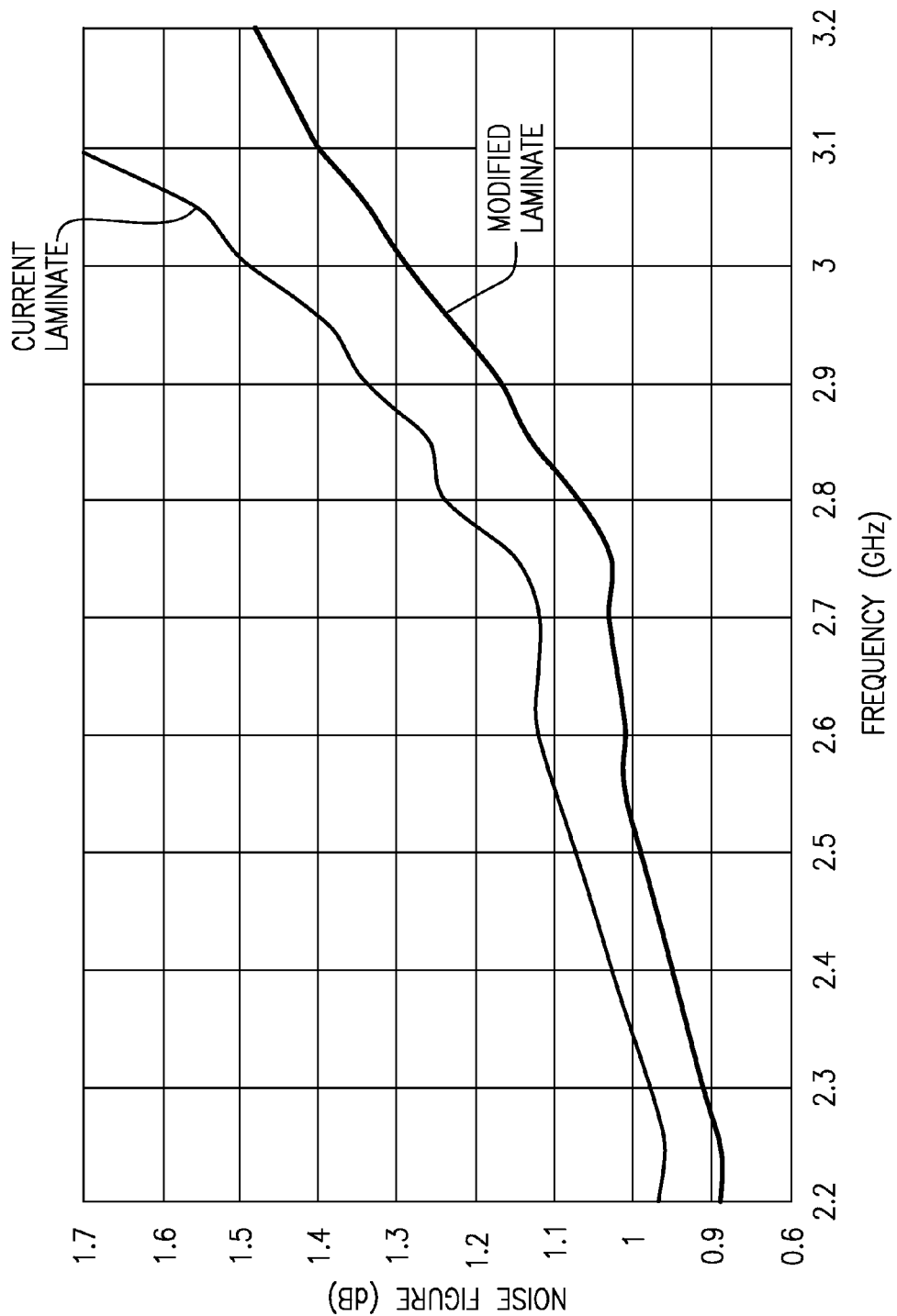
FIG. 12 shows examples of measured noise figures (NF) for LNAs having the current laminate (upper curve) and the modified laminate (lower curve) of FIG. 9 in an example frequency range of 2.2 to 3.2 GHz.

FIGS. 10-12 show examples of improvements in performance that can be obtained for an LNA module having the signal path 104 as described herein in reference to FIG. 9. Similar performance improvements can be obtained for the examples described in reference to FIGS. 5 and 5. For the purpose of comparisons in FIGS. 10-12, such a modified configuration of FIG. 9 is also referred to as a "modified laminate," and the unmodified configuration of FIGS. 4 and 6 is also referred to as a "current laminate."

FIG. 10 shows plots of simulated noise figures (NF) for an LNA having a current laminate (upper curve), and for an LNA having a modified laminate (lower curve) as described herein. Several samples of measured data points at "m2," "m3," and "m4" for the current laminate and "m14," "m13," and "m12" for the modified laminate are indicated in FIG. 10, and also listed in Table 1.

TABLE 1

| Frequency | NF (Current) | NF (Modified) | $NF_{current}-NF_{modified}$ |
|---|---|---|---|
| 1.6 GHz | 0.492 dB (m2) | 0.458 dB (m14) | 0.034 dB |
| 1.9 GHz | 0.586 dB (m3) | 0.539 dB (m13) | 0.047 dB |
| 2.2 GHz | 0.873 dB (m4) | 0.766 dB (m12) | 0.107 dB |

FIG. 11 shows plots of measured noise figures (NF) for the LNA of FIG. 10 having a current laminate (upper curve), and for the LNA of FIG. 10 having a modified laminate (lower curve) as described herein. Table 2 lists reductions in noise figure ($NF_{current}-NF_{modified}$) at different frequencies in a range of 1.4 to 2.3 GHz.

TABLE 2

| Frequency | Reduction in noise figure ($NF_{current}-NF_{modified}$) |
|---|---|
| 1.4 GHz | 0.12 dB |
| 1.45 GHz | 0.1 dB |
| 1.55 GHz | 0.05 dB |
| 1.6 GHz | 0.07 dB |
| 1.65 GHz | 0.05 dB |
| 1.7 GHz | 0.03 dB |
| 1.8 GHz | 0.04 dB |
| 1.9 GHz | 0.06 dB |
| 1.95 GHz | 0.06 dB |
| 2.1 GHz | 0.1 dB |
| 2.15 GHz | 0.11 dB |
| 2.2 GHz | 0.14 dB |
| 2.25 GHz | 0.17 dB |
| 2.4 GHz | 0.21 dB |

As seen in FIG. 11 and in Table 2, reductions in measured noise figures are significant in the example frequency range of 1.4 to 2.4 GHz. In some applications, an additional improvement of about 0.05 dB can be obtained over the example of Table 2, by implementing one or more features as described herein at one or more locations along the RF path associated with the LNA.

FIG. 12 shows that such significant reductions in noise figure can also be obtained in other frequencies. In FIG. 12, the upper curve corresponds to a plot of measured noise figure for another LNA having a current laminate as described herein. The lower curve corresponds to a plot of measured noise figure for another LNA having a modified laminate as described herein. Table 3 lists reductions in noise figure ($NF_{current}-NF_{modified}$) at different frequencies in a range of 2.2 to 3.2 GHz.

TABLE 3

| Frequency | Reduction in noise figure ($NF_{current}-NF_{modified}$) |
|---|---|
| 2.2 GHz | 0.08 dB |
| 2.25 GHz | 0.07 dB |
| 2.3 GHz | 0.07 dB |
| 2.6 GHz | 0.11 dB |
| 2.65 GHz | 0.1 dB |
| 2.7 GHz | 0.09 dB |
| 2.75 GHz | 0.12 dB |
| 2.8 GHz | 0.17 dB |
| 2.85 GHz | 0.13 dB |
| 2.9 GHz | 0.17 dB |
| 2.95 GHz | 0.16 dB |
| 3.0 GHz | 0.2 dB |
| 3.05 GHz | 0.22 dB |
| 3.1 GHz | 0.31 dB |

TABLE 3-continued

| Frequency | Reduction in noise figure ($NF_{current}$-$NF_{modified}$) |
|---|---|
| 3.15 GHz | 0.31 dB |
| 3.2 GHz | 0.41 dB |

Figure 13:
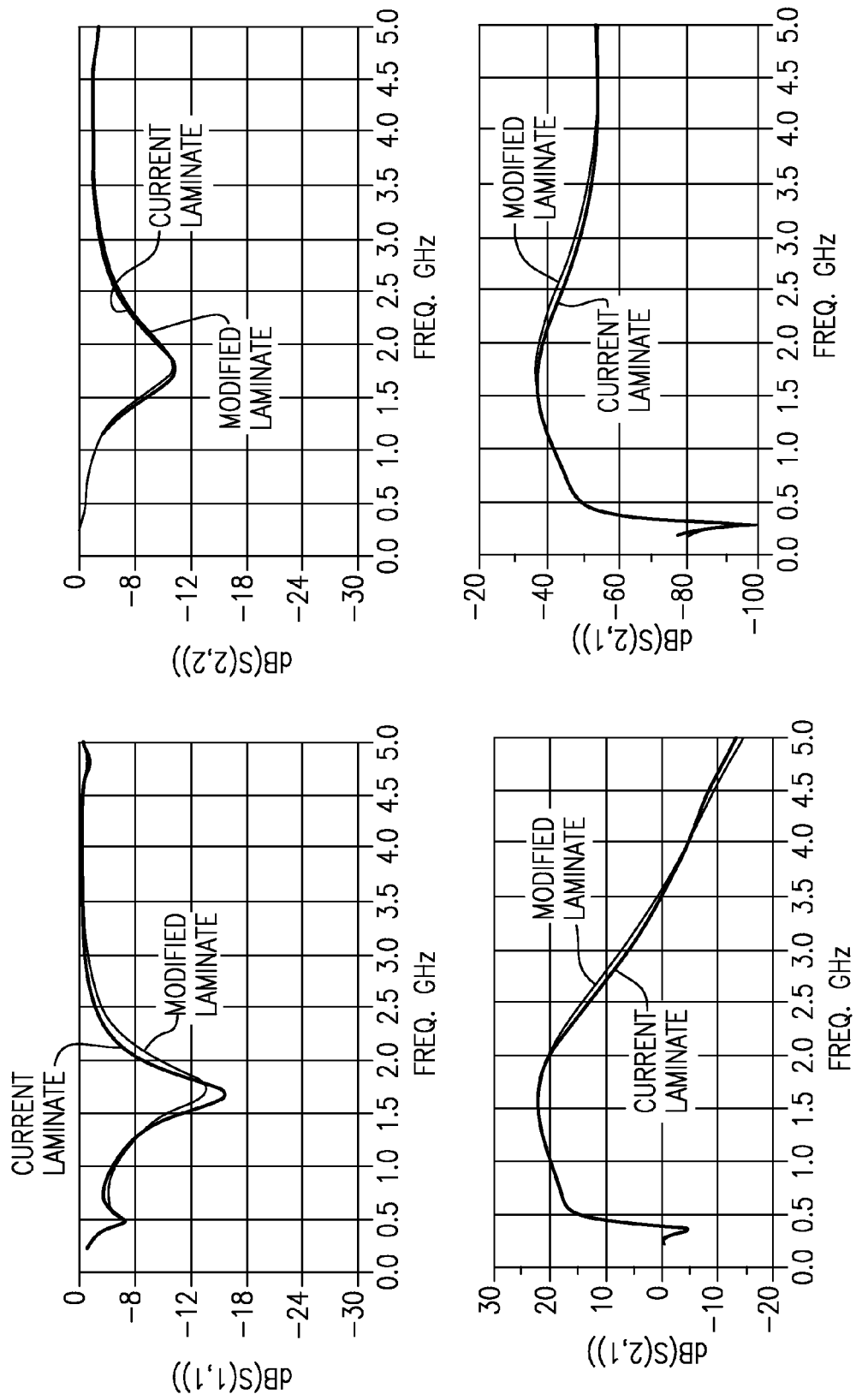
FIG. 13 shows comparisons of various S-parameters for LNAs having the current laminate and the modified laminate of FIG. 9.

In some situations, an improvement in performance in one area can be achieved at the expense of performance degradation in another area. In the examples described in reference to FIGS. 10-12, the improvements in noise figures can be achieved without degrading performance in other areas. FIG. 13 show examples of how performance related to S-parameters remain generally the same between the current laminate configuration and the modified laminate configuration (FIG. 9). The example S-parameter comparisons shown in FIG. 13 are for a relatively small RF signal. A large RF signal also yields similar results where S-parameter performance does not differ significantly between the current and modified laminate configurations.

In the various examples described herein, it is generally desirable to reduce parasitic effects associated with signal paths in laminate layers. Such reduction in parasitic effects can be achieved by, for example, reducing sizes of the pads associated with such laminate layers to thereby reduce overlaps among the pads and to increase edge-to-edge distances between the pads and other conductive features on their respective layers.

In some situations, some controllable amount of parasitic effects may be desirable. As described herein, parasitic effects can be controlled in some quantifiable manner. Thus, it will be understood that one or more features described herein can be implemented to control parasitic effects associated with signal paths in laminate layers. Such a control can include controlled reduction or increase of parasitic effects.

In some implementations, a device and/or a circuit having one or more features described herein can be included in an RF device such as a wireless device. Such a device and/or a circuit can be implemented directly in the wireless device, in a modular form as described herein, or in some combination thereof. In some embodiments, such a wireless device can include, for example, a base station configured to provide wireless services, a cellular phone, a smart-phone, a hand-held wireless device with or without phone functionality, a wireless tablet, etc.

Figure 14:
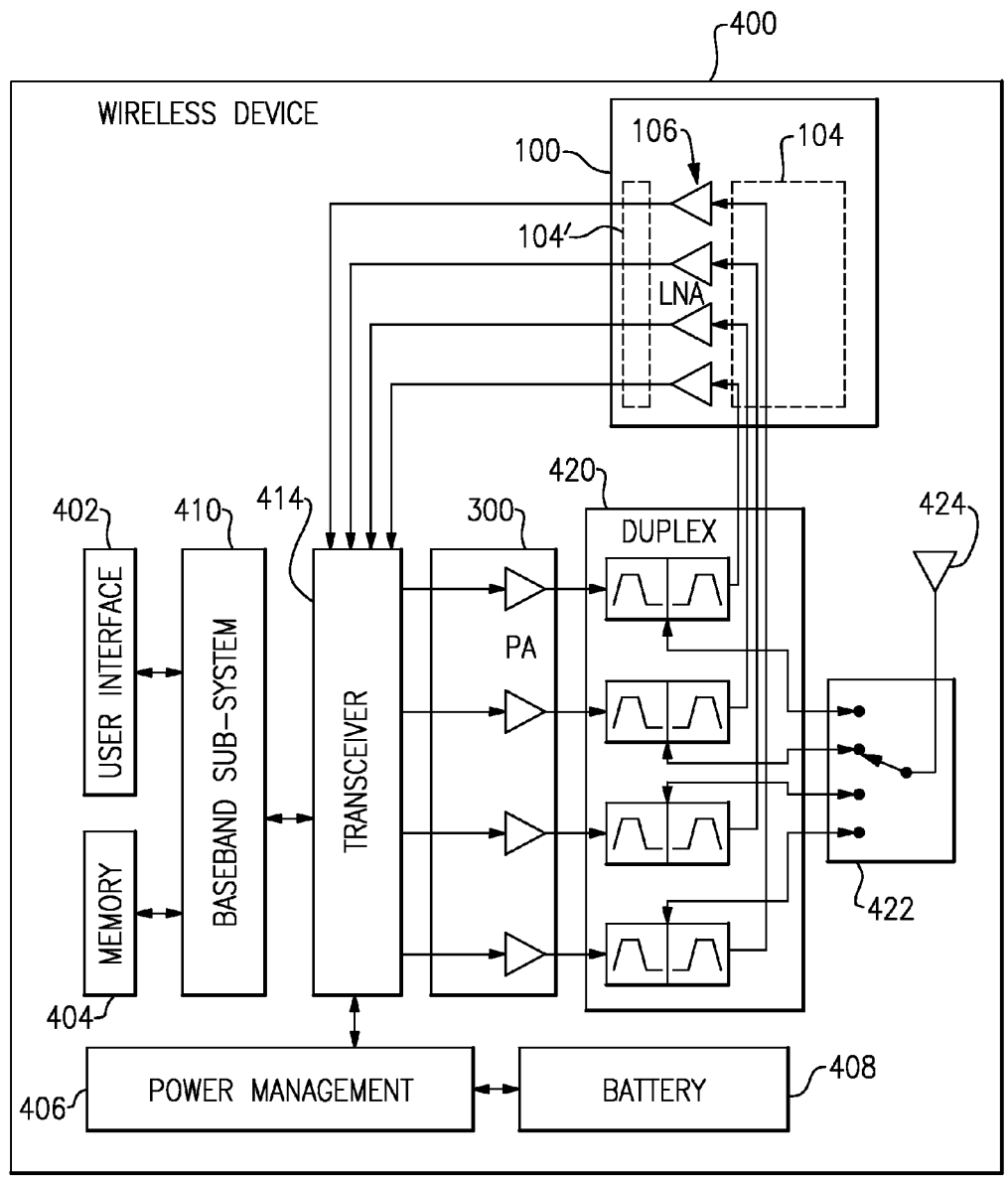
FIG. 14 shows that in some embodiments, a module such as an LNA having one or more features of the present disclosure can be implemented in a wireless device.

FIG. 14 schematically depicts an example wireless device 400 having one or more advantageous features described herein. In the context of signal paths as described herein, an RF module such as an LNA module 100 can include one or more LNAs 106 and one or more signal paths (e.g., 104, 104'). The signal path 104 can receive RF signals from an antenna 424 through a front-end switch 422 and a duplex circuit 420 (e.g., for a frequency-division duplexing (FDD) configuration; for a time-division duplexing (TDD) configuration, the duplexers can be replaced with pass filters) and provide the signals to the LNAs 106. The signal path 104' can route the amplified signals from the LNAs 106 to outputs of the LNA module 100. In some embodiments, one or more of the LNAs 106 can be implemented in a semiconductor die. Such a die can be mounted on a laminate substrate having one or more signal paths having one or more features described herein.

In the example wireless device 400, a power amplifier (PA) 300 having a plurality of amplification paths can provide an amplified RF signal to the switch 422 (via the duplexer 420), and the switch 422 can route the amplified RF signal to the antenna 424. The PA 300 can receive an unamplified RF signal from a transceiver 414.

The transceiver 414 is shown to interact with a baseband sub-system 410 that is configured to provide conversion between data and/or voice signals suitable for a user and RF signals suitable for the transceiver 414. The transceiver 414 is also shown to be connected to a power management component 406 that is configured to manage power for the operation of the wireless device 400.

The baseband sub-system 410 is shown to be connected to a user interface 402 to facilitate various input and output of voice and/or data provided to and received from the user. The baseband sub-system 410 can also be connected to a memory 404 that is configured to store data and/or instructions to facilitate the operation of the wireless device, and/or to provide storage of information for the user.

A number of other wireless device configurations can utilize one or more features described herein. For example, a wireless device does not need to be a multi-band device. In another example, a wireless device can include additional antennas such as diversity antenna, and additional connectivity features such as Wi-Fi, Bluetooth, and GPS.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While some embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A laminate substrate for mounting radio-frequency (RF) components, the laminate substrate comprising:
   a plurality of layers vertically stacked on top of each other;
   a plurality of conductor pads, a respective conductor pad positioned within a respective layer of the laminate substrate including an input pad on a first layer, an output pad on a second layer such that the output pad does not completely overlap with the input pad, and at least one intermediate pad on a third layer between the input and output pads; and
   a plurality of connection features to provide a signal path between the input pad and the output pad, including a first connection feature formed between the input pad and the intermediate pad, the first connection feature positioned at a first end of the intermediate pad and a second connection feature formed between the intermediate pad and a conductor pad distinct from the input pad, the second connection feature positioned at a second end of the intermediate pad, opposite from the first end.

2. The laminate substrate of claim 1 wherein the plurality of layers includes greater than or equal to 4 layers.

3. The laminate substrate of claim 1 wherein the signal path is an input signal path or an output signal path for an RF component.

4. The laminate substrate of claim 3 wherein the RF component includes a low-noise amplifier (LNA).

5. The laminate substrate of claim 1 wherein the first connection feature and second connection feature each includes one or more vias.

6. The laminate substrate of claim 5 wherein the first and second connection features are positioned at opposite ends of the intermediate pad from each other, each of the opposite ends defining an area on the intermediate pad sufficient to allow formation of the one or more vias.

7. The laminate substrate of claim 1 further comprising a first insulator layer disposed between the first layer and the third layer.

8. The laminate substrate of claim 1 wherein at least a portion of the intermediate pad does not overlap with the input pad or a portion of the input pad does not overlap with the intermediate pad.

9. The laminate substrate of claim 8 wherein the respective layers of the plurality of layers of the laminate substrate further include other conductor features about the conductor pads.

10. The laminate substrate of claim 1 wherein the intermediate pad defines a cutout reducing overlap between the intermediate pad and a neighboring conductor pad to thereby reduce parasitic effect associated with the signal path.

11. A radio-frequency (RF) module, comprising:
   a laminate substrate configured to receive a plurality of components, the laminate substrate including a plurality of layers vertically stacked on top of each other, a plurality of conductor pads, a respective conductor pad positioned within a respective layer of the laminate substrate including an input pad on a first layer, an output pad on a second layer such that the output pad does not completely overlap with the input pad, and at least one intermediate pad on a third layer between the input and output pads, the laminate substrate further including a plurality of connection features to provide a signal path between the input pad and the output pad, including a first connection feature formed between the input pad and the intermediate pad, the first connection feature positioned at a first end of the intermediate pad and a second connection feature formed between the intermediate pad and a conductor pad distinct from the input pad, the second connection feature positioned at a second end of the intermediate pad, opposite from the first end; and
   an RF integrated circuit disposed on the laminate substrate, the RF integrated circuit connected to the output pad of the signal path.

12. The module of claim 11 wherein the RF integrated circuit includes a low-noise amplifier (LNA).

13. The module of claim 12 wherein respective positions of the conductor pads reduce parasitic effects associated with the conductor pads and result in a reduced noise figure associated with the LNA.

14. The module of claim 12 wherein the output pad of the signal path is connected to an input of the LNA.

15. The module of claim 14 further comprising a matching circuit disposed between the output pad of the signal path and the input of the LNA.

16. The module of claim 12 wherein the output pad of the signal path is connected to an output of the LNA.

17. The module of claim 16 further comprising a matching circuit disposed between the output of the LNA and the output pad of the signal path.

18. The module of claim 11 wherein the RF integrated circuit is implemented on a semiconductor die.

19. The module of claim 11 wherein the intermediate pad defines a cutout reducing overlap between the intermediate pad and a neighboring conductor pad to thereby reduce parasitic effect associated with the signal path.

20. A wireless device, comprising:
   an antenna configured to receive a radio-frequency (RF) signal;
   a low-noise amplifier (LNA) module connected to the antenna, the LNA module including an LNA configured to amplify the RF signal, the LNA module further including a laminate substrate having a signal path for routing the RF signal to the LNA, the signal path including a plurality of layers vertically stacked on top of each other, a plurality of conductor pads, a respective conductor pad positioned within a respective layer of the laminate substrate including an input pad, an output pad such that the output pad does not completely overlap with the input pad, and at least one intermediate pad between the input and output pads, the signal path further including a plurality of connection features to provide a signal path between the input pad and the output pad, including a first connection feature formed between the input pad and the intermediate pad, the first connection feature positioned at a first end of the intermediate pad and a second connection feature formed between the intermediate pad and a conductor pad distinct from the input pad, the second connection feature positioned at a second end of the intermediate pad, opposite from the first end; and
   a receiver circuit connected to the LNA module, the receiver circuit configured to process the amplified RF signal received from the LNA module.

* * * * *